US009219103B2

(12) United States Patent
Lee et al.

(10) Patent No.: US 9,219,103 B2
(45) Date of Patent: Dec. 22, 2015

(54) ORGANIC LIGHT EMITTING DIODE DISPLAY

(75) Inventors: Chang-Ho Lee, Yongin (KR); Hee-Joo Ko, Yongin (KR); Il-Soo Oh, Yongin (KR); Se-Jin Cho, Yongin (KR); Jin-Young Yun, Yongin (KR); Hyung-Jun Song, Yongin (KR); Young-Woo Song, Yongin (KR); Kyu-Hwan Hwang, Yongin (KR); Seok-Gyu Yoon, Yongin (KR); Jae-Heung Ha, Yongin (KR); Jong-Hyuk Lee, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 365 days.

(21) Appl. No.: 13/085,389

(22) Filed: Apr. 12, 2011

(65) Prior Publication Data
US 2011/0273409 A1    Nov. 10, 2011

(30) Foreign Application Priority Data

May 6, 2010 (KR) .................. 10-2010-0042595

(51) Int. Cl.
G09G 5/00 (2006.01)
H01L 27/32 (2006.01)

(52) U.S. Cl.
CPC ....... *H01L 27/326* (2013.01); *H01L 2251/5323* (2013.01)

(58) Field of Classification Search
CPC ............ H01L 2251/5323; H01L 27/326
USPC ............... 345/76, 82, 92, 5, 690, 204
See application file for complete search history.

(56) References Cited

U.S. PATENT DOCUMENTS

| 2006/0001366 A1* | 1/2006 | Chung et al. ............ 313/506 |
| 2006/0119556 A1* | 6/2006 | Winters et al. ............ 345/82 |
| 2006/0158467 A1* | 7/2006 | Larson et al. ............ 345/694 |
| 2006/0164346 A1* | 7/2006 | Liao et al. ............ 345/76 |
| 2007/0018943 A1* | 1/2007 | Bayrle et al. ............ 345/102 |
| 2008/0007492 A1* | 1/2008 | Koh et al. ............ 345/76 |
| 2009/0243470 A1* | 10/2009 | Chu et al. ............ 313/504 |
| 2010/0237374 A1* | 9/2010 | Chu et al. ............ 257/98 |
| 2011/0043435 A1* | 2/2011 | Hebenstreit et al. ............ 345/5 |

FOREIGN PATENT DOCUMENTS

| JP | 3788313 B2 | 4/2006 |
| JP | 2008-112112 A | 5/2008 |
| JP | 2010-003880 A | 1/2010 |
| KR | 10-2005-0066970 A | 6/2005 |
| KR | 10-2007-0029007 A | 3/2007 |
| WO | WO 2010046833 A1 * | 4/2010 ...... H01L 51/52 |

OTHER PUBLICATIONS

Korean Office Action dated Sep. 30, 2011 for Korean Patent Application No. KR 10-2010-0042595 which corresponds to captioned U.S. Appl. No. 13/085,389.

* cited by examiner

*Primary Examiner* — Priyank Shah
*Assistant Examiner* — Tony Davis
(74) *Attorney, Agent, or Firm* — Knobbe, Martens, Olson & Bear, LLLP

(57) ABSTRACT

An organic light emitting diode display is disclosed. The display includes some pixel areas which are opaque and some pixel areas which are partially opaque and partially transparent. Selectively displaying the light emission of the pixel areas allows for control of the relative brightness of a displayed image and an object behind the display.

23 Claims, 8 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2010-0042595 filed in the Korean Intellectual Property Office on May 6, 2010, the entire contents of which are incorporated herein by reference.

BACKGROUND

1. Field

The described technology relates generally to an organic light emitting diode (OLED) display. More particularly, the described technology relates generally to an organic light emitting diode display that displays an image using light emitted from pixel areas, and transmits light from behind the display through transparent areas.

2. Description of the Related Technology

Organic light emitting diode displays are displays that emit light and have relatively thin profiles and weight compared to liquid crystal displays (LCD), because they do not need independent light sources. Further, organic light emitting diode displays have excellent properties, such as low power consumption, high luminance and high response speed.

Recently, an organic light emitting diode display with a transparency option has been developed. With this product, it is possible to observe the background behind the organic light emitting diode display. The transparent organic light emitting diode display has a plurality of pixel regions spaced apart from each other and transparent regions positioned between the pixel regions.

Therefore, when the pixel areas are in the off state, light from an object behind the organic light emitting diode display passes through the transparent regions, such that an observer can see a lit background or scene. Further, the pixel areas emit light when in the "on" state, such that it is possible to display images.

However, since the pixel areas are spaced apart by structural elements in the organic light emitting diode display, the luminance of a display screen when the pixel areas emit light is not high. Further, the light of the background behind the organic light emitting diode display passes through the transparent regions even when the pixel areas emit light. However, objects in the background overlap with the image displayed in the foreground. Therefore, it is difficult to clearly display either the background object or the image to a user.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect is an organic light emitting diode display. The display includes a substrate with a transparent region, and a plurality of pixel areas spaced apart from each other on the substrate with the transparent region therebetween. Each pixel area includes a first pixel area having a first driver and a first organic light emitting element, and a second pixel area spaced apart from the first pixel area and having a second driver and a second organic light emitting element. The first pixel area and the second pixel area are independently turned on and selectively emit light according to the same image data.

Another inventive aspect is an organic light emitting diode display. The display includes a substrate with a transparent region, and a plurality of pixel areas spaced apart from each other on the substrate with the transparent region therebetween. The display also includes a first scan driver and a second scan driver on the substrate, and a data driver on the substrate. Each of the pixel areas includes a first pixel area with a first driver electrically connected with the first scan driver and the data driver, and a first organic light emitting element electrically connected with the first driver. Each of the pixel areas also includes a second pixel area with a second driver spaced apart from the first pixel area and electrically connected with the second scan driver and the data driver, and a second organic light emitting element electrically connected with the second driver. The first pixel area and the second pixel area selectively emit light according to the same image data.

DETAILED DESCRIPTION OF CERTAIN INVENTIVE EMBODIMENTS

Figure 1:
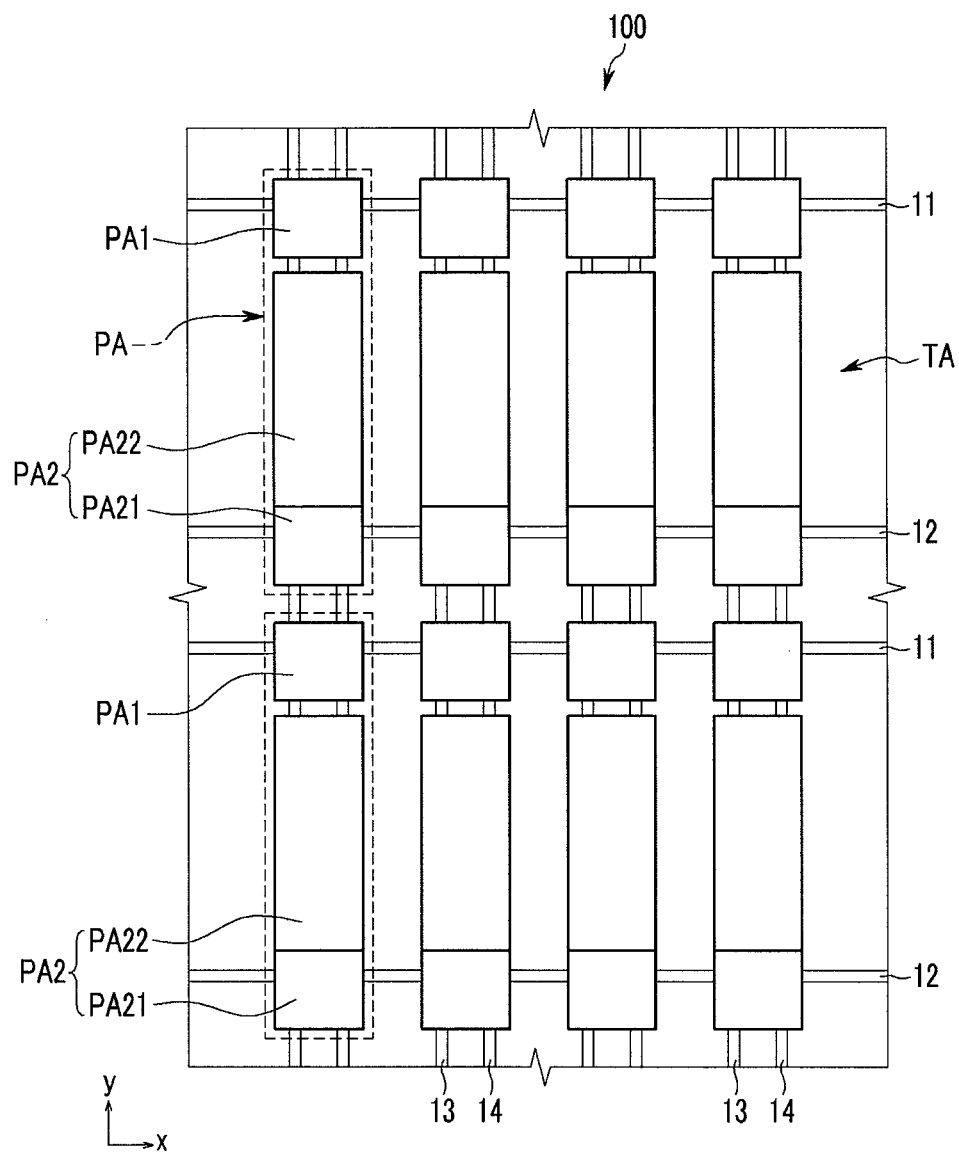
FIG. 1 is a schematic layout view of an organic light emitting diode display according to an exemplary embodiment.

Various inventive aspects and embodiments are described hereinafter with reference to the accompanying drawings, in which exemplary embodiments of the invention are shown. As those skilled in the art would realize, the described embodiments may be modified in various ways.

In order to explain the various aspects, certain concepts that are not related to the description will be omitted. Like reference numerals generally designate like elements throughout the specification. In addition, the size and thickness of each component shown in the drawings are often arbitrarily shown simply for understanding and ease of description, but practical embodiments are not limited thereto.

It will be understood that when an element such as a layer, film, region, or substrate is referred to as being "on" another element throughout the specification, it can be directly on the other element or intervening elements may also be present FIG. 1 is a schematic layout view of an organic light emitting diode display according to an exemplary embodiment.

Referring to FIG. 1, the organic light emitting diode display 100 includes a plurality of pixel areas PA spaced apart from each other with transparent regions TA therebetween. A first direction may be the horizontal direction (x-axis direction in FIG. 1) on the screen of the organic light emitting diode display 100 and a second direction may be a vertical direction (y-axis direction in FIG. 1) on the screen of the organic light emitting diode display 100.

Each pixel area PA includes one subpixel or a plurality of subpixels. The subpixel is the minimum unit for displaying an image and the organic light emitting diode display 100 displays an image using a plurality of pixels. The following description discusses one subpixel in each of the pixel areas PA. Embodiments, however, are not limited to the following examples.

Each of the pixel areas PA is divided into two pixel areas that are independently turned on. That is, each of the pixel areas PA includes a first pixel area PA1 and a second pixel area PA2 spaced apart from the first pixel area PA1 and having a light emitting area larger than the first pixel area PA1. A first organic light emitting element (not shown) and a first driver (not shown) are disposed in the first pixel area PA1, and a second organic light emitting element (not shown) and a second driver (not shown) are disposed in the second pixel area PA2.

The first pixel area PA1 is turned on when the organic light emitting diode display 100 operates and the second pixel area PA2 is selectively turned on by a selective signal from the user. The second pixel area PA2 includes a reflective electrode and a transparent electrode, which are described below. The region where the reflective electrode region is positioned is on opaque region PA21 and the region where the transparent electrode is positioned is a transparent region PA22. The transparent region PA22 is transparent when the second pixel, area PA2 is in the off state, such that it functions substantially the same as the transparent region TA.

Figure 2:
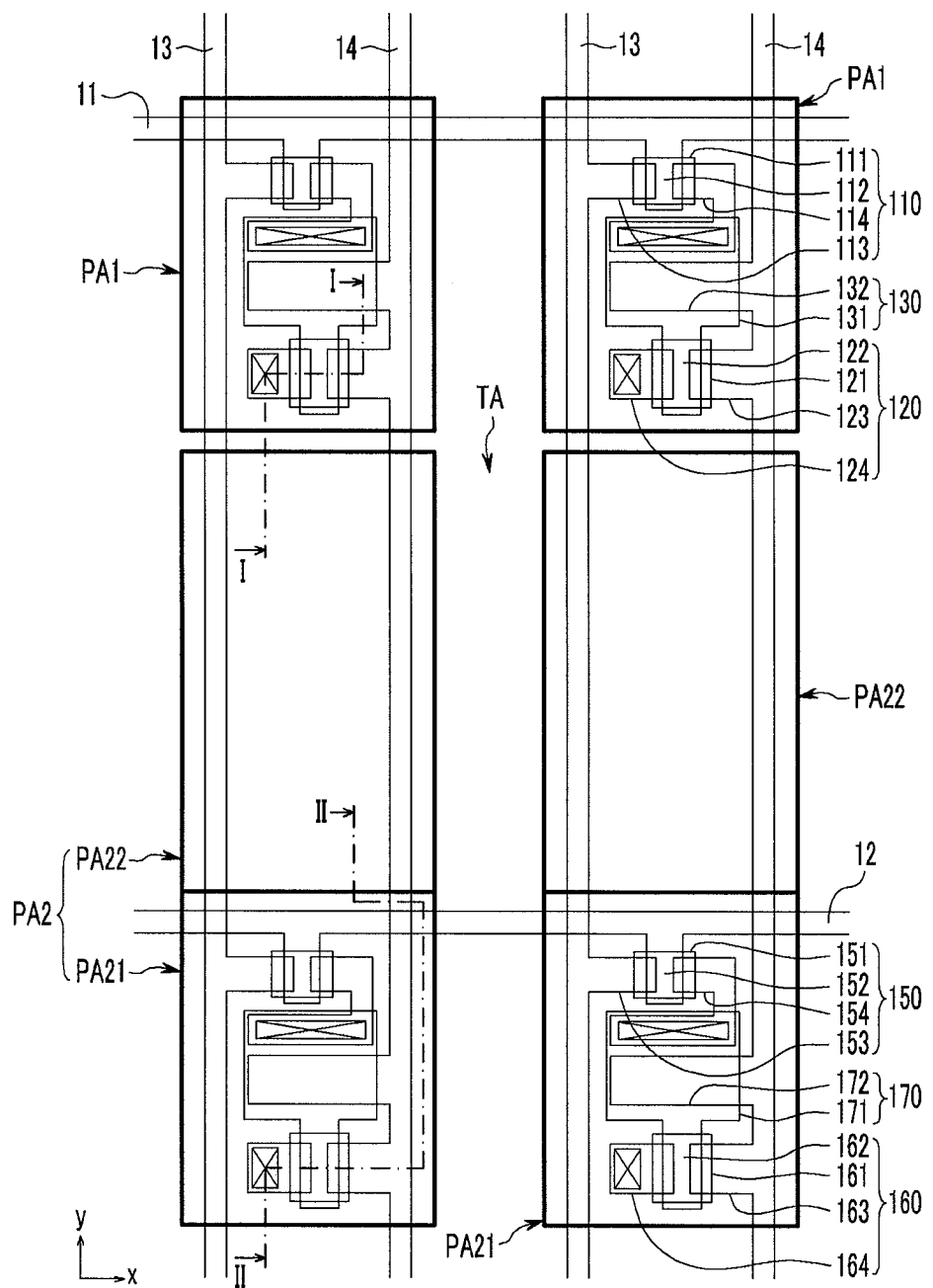
FIG. 2 is a layout view of an organic light emitting diode display according to an exemplary embodiment.
Figure 3:
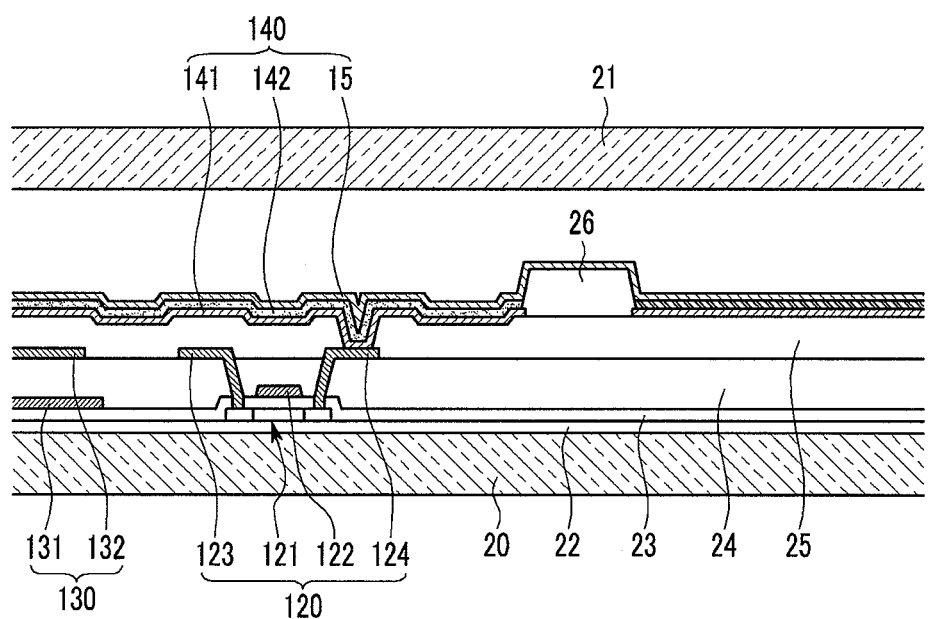
FIG. 3 is a cross-sectional view taken along line I-I of FIG. 2.

FIG. 2 is a layout view of an organic light emitting diode display according to an exemplary embodiment. FIG. 3 is a cross-sectional view taken along line I-I of FIG. 2, and FIG. 4 is a cross-sectional view taken along line II-II of FIG. 2.

Figure 4:
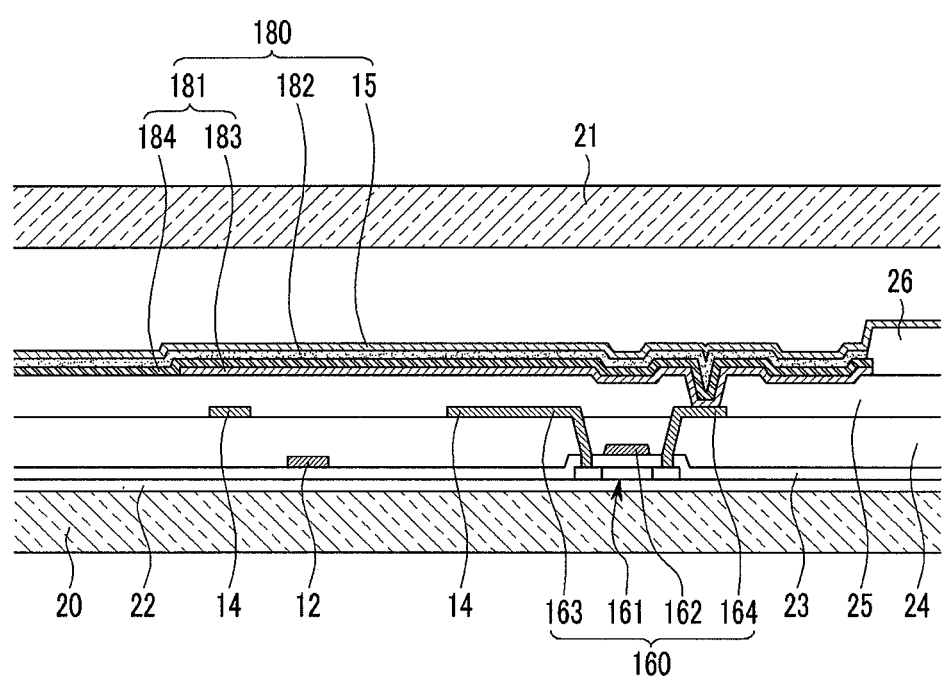
FIG. 4 is a cross-sectional view taken along line II-II of FIG. 2.

Referring to FIG. 2 to FIG. 4, the organic light emitting diode display 100 includes a first switching thin film transistor 110 formed in the first pixel area PA1, a first driving thin film transistor 120, a first capacitor 130, and a first organic light emitting element 140. A first driver of the first pixel area PA1 comprises the first switching thin film transistor 110, the first driving thin film transistor 120, and the first capacitor 130.

The organic light emitting diode display 100 includes a second switching thin film transistor 150 formed in the second pixel area PA2, a second driving thin film transistor 160, a second capacitor 170, and a second organic light emitting element 180. A second driver of the second pixel area PA2 comprises the second switching thin film transistor 150, the second driving thin film transistor 160, and the second capacitor 170.

Although the first and second drivers each include two thin film transistors and one capacitor in the above, the organic light emitting diode display 100 of the present exemplary embodiment is not limited to the example described above. That is, the organic light emitting diode display 100 may include three or more thin film transistors and two or more capacitors in the first pixel area PA1 and the second pixel area PA2, and additional wires may be further formed. A compensation circuit may comprise any additional thin film transistors and capacitors.

The organic light emitting diode display 100 includes first gate lines 11, second gate lines 12, data lines 13, and common voltage lines 14. The first gate line 11 is arranged in a first direction (x-axis direction) across the first pixel areas PA1 and the second gate line 12 is arranged in parallel with the first gate line 11 across the second pixel areas PA2. The data lines 13 and common voltage lines 14 are arranged in a second direction (y-axis direction) across the first pixel area PA1 and the second pixel area PA2.

The data lines 13 and the common voltage lines 14 cross the first and second gate lines 11 and 12. Therefore, in FIG. 2, the minimum possible number of first gate lines 11, second gate lines 12, data lines 13, and common voltage lines 14 are formed in the transparent region TA. At least one of the first gate line 11, the second gate line 12, the data lines 13, and the common voltage lines 14 is made of transparent conductive material and increases light transmission of the transparent region TA.

The first organic light emitting element 140 includes a first pixel electrode 141, a first organic emission layer 142 formed on the first pixel electrode 141, and a common electrode 15 formed on the first organic emission layer 142. The second organic light emitting element 180 includes a second pixel electrode 181, a second organic emission layer 182 formed on the second pixel electrode 181, and a common electrode 15 formed on the second organic emission layer 182. The common electrode 15 of the first organic light emitting element 140 and the common electrode 15 of the second organic light emitting element 180 may be integrally connected. That is, one common electrode 15 may be formed throughout the pixel area PA and the transparent region TA.

The first pixel electrode 141 and the second pixel electrode 181 may be hole injection electrodes and the common electrode 15 may be an electron injection electrode. However, practical embodiments are not limited to the example described above, and the first pixel electrode 141 and the second pixel electrode 181 may be electron injection electrodes and the common electrode 15 may be a hole injection electrode, in accordance with the driving method.

Holes and electrons are injected into the first organic emission layer 142 from the first pixel electrode 141 and the common electrode 15, respectively. Similarly, holes and electrons are injected into the second organic emission layer 182 from the second pixel electrode 181 and the common electrode 15, respectively. The first organic emission layer 142 and the second organic emission layer 182 emit light because of energy generated when excitons formed when the injected hole or electron drops from an excited state to a ground state.

The first and second organic emission layers 142 and 182 positioned in one pixel area (PA) emit the same color of light. The first and second organic emission layers 142 and 182 may be, for example, one of a red organic emission layer, a green organic emission layer, and a blue organic emission layer. The first and second organic emission layers 142 and 182 may include one or more of a hole injection layer (HIL), a hole transport layer (HTL), an electron injection layer (EIL), and an electron transport layer (ETL).

The first pixel electrode 141 and the first organic emission layer 142 formed thereon may be formed over the entire first pixel area PA1. That is, the region where the first pixel electrode 141 and the first organic emission layer 142 are formed substantially corresponds to the first pixel area PA1 and the overlapping portions of the first pixel electrode 141 and the first organic emission layer 142 define the first pixel area PAL The first pixel electrode 141 and the first organic emission layer 142 cover all of the first driver, the first gate line 11, the data line 13, and the common voltage line 14.

The second pixel electrode 181 and the second organic emission layer 182 formed thereon may be formed over the entire second pixel area PA2. That is, the region where the second pixel electrode 181 and the second organic emission layer 182 overlap the second pixel area PA2 and the second pixel electrode 181 and the second organic emission layer 182 defines the second pixel area PA2. The second pixel electrode 181 and the second organic emission layer 182 cover all of the second driver, the second gate line 12, the data line 13, and the common voltage line 14.

The second pixel electrode 181 includes a reflective electrode 183 and a transparent electrode 184. The reflective electrode 183 is positioned on the second driver, covering the second driver. The transparent electrode 184 is electrically connected with the reflective electrode 183 while covering a portion of or the entire reflective electrode 183, and extends in the second direction (y-axis direction) from the reflective electrode 183. FIG. 4 shows the transparent electrode 184 overlapping and covering the entire electrode 183. The reflective electrode 183 is electrically connected with the second driver and receives voltage for driving the second pixel electrode 181.

The second organic emission layer 182 is transparent when voltage less than a threshold is applied. Therefore, the region where the reflective electrode 183 is positioned in the second pixel area PA1 is the opaque region PA21 and the region that does not overlap the reflective electrode 183 in the transparent electrode 184 is a transparent region PA22. The transparent region PA22 is transparent when the second pixel area PA2 is in the off state, and emits light when the second pixel area PA2 is in the on state.

The common electrode 15 and the transparent electrode 184 comprise a transparent conductive material having light transmission of about 70% or more. The first pixel electrode 141 and the electrode 183 are made of a reflective conductive material.

Therefore, the first organic emission layer 142 and the second organic emission layer 182 are part of a front light emitting structure that emits light through the common electrode 15 to display an image in the opaque region PA21 of the first pixel area PA1 and the second pixel area PA2. Further, the second organic emission layer 182 is part of a double-sided light emitting structure that emits light through the transparent electrode 184 and the common electrode 15 to display an image in the transparent region PA22 of the second pixel area PA2.

When the first pixel electrode 141 and the second pixel electrode 181 are hole injection electrodes and the common electrode 15 is a electron injection electrode, the first pixel electrode 141 and the electrode 183 are made of a reflective conductive material having high work function, and the transparent electrode 184 is made of a conductive material having high work function. Further, the common electrode 15 is made of a conductive material having low work function.

For example, the first pixel electrode 141 and the electrode 183 may be formed as a structure including one or more of a first layer having high work function and a second layer having high reflective ratio. The first layer may include at least one of ITO, IZO, ZnO, $In_2O_3$, Cr, C, a-Si, Ni, Pd, Au, Pt and Pb. The second layer may include AlNd, Al, Mo, Ag, or alloys thereof.

The transparent electrode 184 may include any of ITO, IZO, ZnO and $In_2O_3$. The common electrode 15 may include any one of Mg, Ag, Ca, Li, Al and alloys thereof and may have a very small thickness to have light transmission of about 70% or more. When the light transmission of the common electrode 15 and the transparent electrode 184 is less than about 70%, sufficient light transmission in a transparent mode of the organic light emitting diode display 100 may not occur.

The first switching thin film transistor 110 and the second switching thin film transistor 150 include switching semiconductor layers 111 and 151, switching gate electrodes 112 and 152, switching source electrodes 113 and 153, and switching drain electrodes 114 and 154, respectively. The first driving thin film transistor 120 and the second driving thin film transistor 160 include semiconductor layers 121 and 161, driving gate electrodes 122 and 162, driving source electrodes 123 and 163, and driving drain electrodes 124 and 164, respectively. The first and second capacitors 130 and 170 include first capacitor plates 131 and 171 and second capacitor plates 132 and 172, respectively, which are disposed with an interlayer insulating layer 24 (see FIGS. 3 and 4) therebetween.

The first and second switching thin film transistors 110 and 150 are used as switching elements that select pixel areas for emitting light. The switching gate electrodes 112 and 152 are connected to the first gate line 11 or the second gate line 12 and the switching source electrodes 113 and 153 are connected to the data line 13. The switching drain electrode 114 and 154 are spaced from the switching source electrodes 113 and 153 and are connected to the first capacitor plates 131 and 171.

The first and second driving thin film transistors 120 and 160 apply a driving voltage for emitting light to the first and second organic emission layers 142 and 182 in the selected pixel areas through the first and second pixel electrodes 141 and 181. The first and second driving gate electrodes 122 and 162 are connected to the first capacitor plates 131 and 171, respectively, and the first and second driving source electrodes 123 and 163 and the second capacitor plates 132 and 172 are connected with the common voltage line 14. The first and second driving drain electrodes 124 and 164 are connected with the first pixel electrode 141 and the second pixel electrode 181 through contact holes, respectively.

The first switching thin film transistor 110 is operated by the voltage applied to the first gate line 11 to transmit the data voltage applied to the data line 13 to the first driving thin film transistor 120. The second switching thin film transistor 150 is operated by the voltage applied to the second gate line 12 to transmit the data voltage applied to the data line 13 to the second driving thin film transistor 160.

The first and second capacitor plates 130 and 170 store voltage corresponding to the difference between the common voltage applied from the common voltage line 14 and the data voltage transmitted from the first and second switching thin film transistors 110 and 150. Further, current corresponding to the voltage stored in the first and second capacitor plates 130 and 170 flows to the first and second organic light emitting elements 140 and 180 through the first and second driving thin film transistors 120 and 160, such that the first and second organic emission layers 142 and 182 emit light.

Referring to FIG. 3, the components described above are disposed on a substrate member 20 and the organic light emitting diode display 100 may further include an encapsulation substrate 21 covering the substrate member 20. A buffer layer 22, a gate insulating layer 23, an interlayer insulating layer 24, a planarization layer 25, and pixel defining layer 26 are further formed on the substrate member 20.

In some embodiments, the buffer layer 22 contacts the substrate member 20 and is formed directly on the substrate member 20. The gate insulating layer 23 is positioned between the first and second driving semiconductor layers 121 and 161 and the first and second driving gate electrodes 122 and 162, and insulates the first and second driving semiconductor layers 121 and 161 from the first and second driving gate electrodes 122 and 162. The interlayer insulating layer 24 is disposed on the first and second driving gate electrodes 122 and 162 and insulates the first and second driving source electrodes 123 and 163 and the first and second driving drain electrodes 124 and 164 from the first and second driving gate electrodes 122 and 162. The planarization layer 25 covers the first and second driving source electrodes 123 and 163 and the first and second driving drain electrodes 124 and 164 and is positioned under the first and second pixel electrode 141 and 181.

The position of the gate insulating layer 23, interlayer insulating layer 24, and the planarization layer 25 is substantially the same with respect to the first and second switching thin film transistors 110 and 150, which are not shown in FIGS. 3 and 4.

The pixel defining layer 26 is formed on the planarization layer 25 and has openings corresponding to the first and second pixel areas PA1 and PA2 to expose the first and second pixel electrodes 141 and 181. The first and second organic emission layers 142 and 182 are formed on the first and second pixel electrode 141 and 181 in the openings of the pixel defining layer 26. The common electrode 15 is formed on the first and second organic emission layers 142 and 182 and the pixel defining layer 26. The buffer layer 22, gate insulating layer 23, interlayer insulating layer 24, planarization layer 25, and pixel defining layer 26 are made of a transparent or high-transmittance insulating material.

Figure 5:
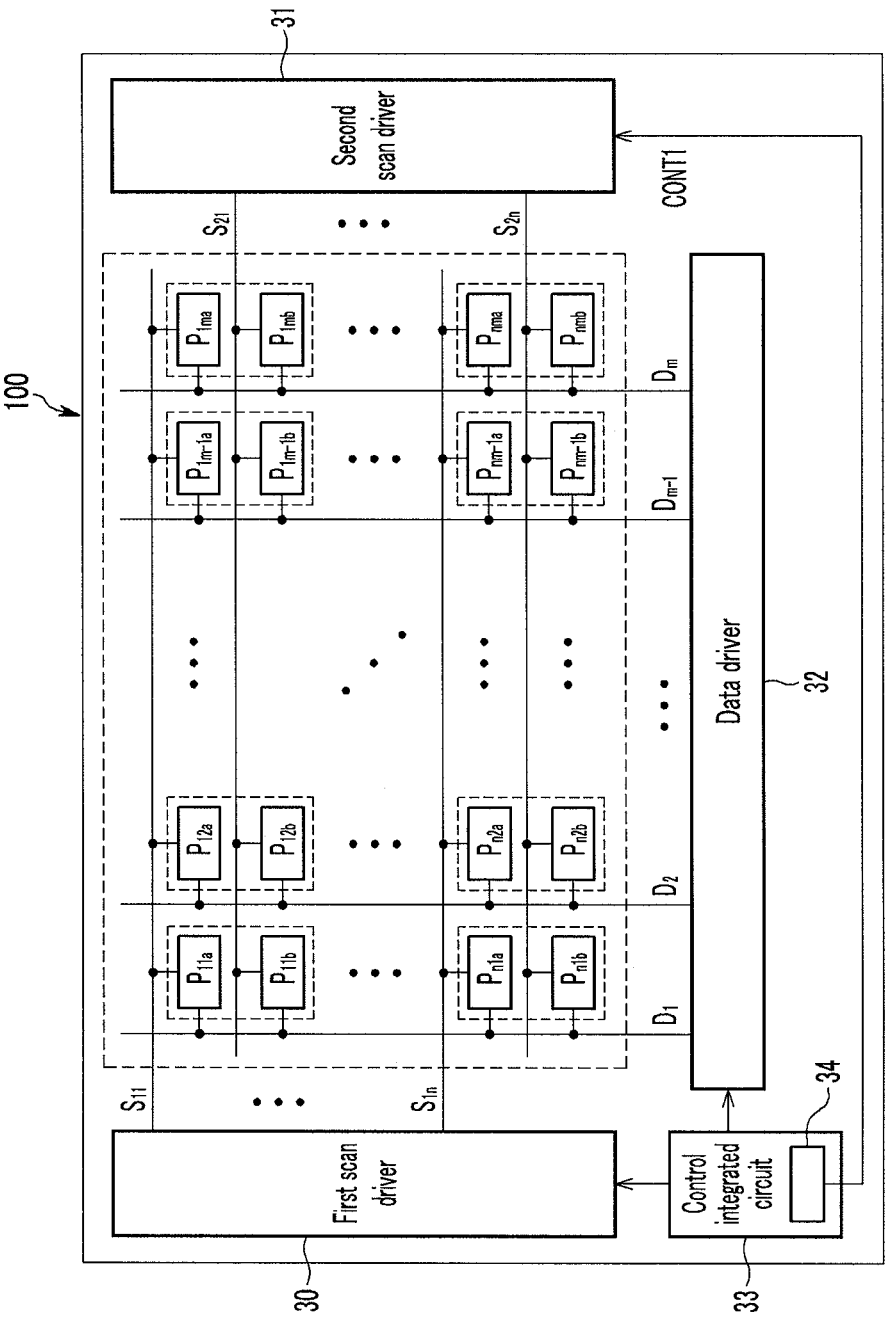
FIG. 5 is a block diagram showing a configuration of an organic light emitting diode display according to an exemplary embodiment.

FIG. 5 is a block diagram illustrating a configuration of an organic light emitting diode display according to an exemplary embodiment.

Referring to FIG. 5, the organic light emitting diode display 100 includes a first scan driver 30, a second scan driver 31, a data driver 32, and a control integrated circuit 33. The control integrated circuit 33 may include a power supply, a timing controller, and a second scan driver controller 34.

The first scan driver 30 is connected with first gate lines $S_{11}$-$S_{1n}$ to apply scan signals to first gate lines $S_{11}$-$S_{1n}$ and the second scan driver 31 is connected with second gate lines $S_{21}$-$S_{2n}$ to apply scan signal to the second gate lines $S_{21}$-$S_{2n}$. The data driver 32 supplies data voltage corresponding to R, G, B data to data lines D1-Dm. The first pixel areas $P_{11a}$-$P_{nma}$ are connected to first gate lines $S_{11}$-$S_{1n}$ and data lines D1-Dm and the second pixel areas $P_{11b}$-$P_{nmb}$ are connected to the second gate lines $S_{21}$-$S_{2n}$, where each pixel (or subpixel) includes one of the first pixel areas $P_{11a}$-$P_{nma}$ and one of the second pixel areas $P_{11b}$-$P_{nmb}$.

The second scan driver controller 34 is switched on in response to an input from a user and applies a driving-on signal CONT 1 to the second scan driver 31. Therefore, the second pixel areas $P_{11b}$-$P_{nmb}$ are turned on only in response from an input from a user, whereas the first pixel areas $P_{11a}$-$P_{nma}$ are turned on by the first scan driver 30. The first pixel areas $P_{11a}$-$P_{nma}$ and the second pixel areas $P_{11b}$-$P_{nmb}$ are independently turned on, and share the same data line D1-Dm. Therefore, they emit light according to the same data.

Figure 6:
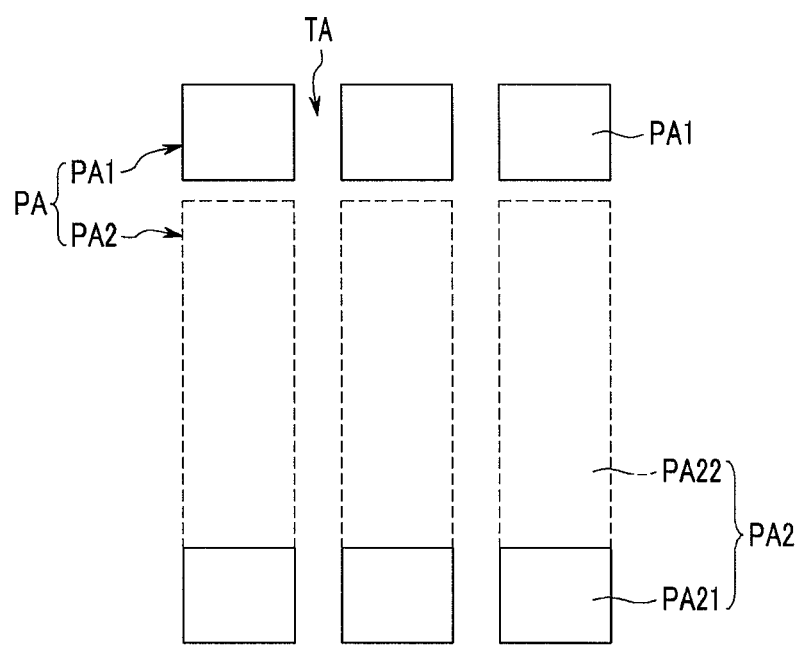
FIG. 6 is a schematic layout view showing a transparence mode of an organic light emitting diode display according to an exemplary embodiment.
Figure 7:
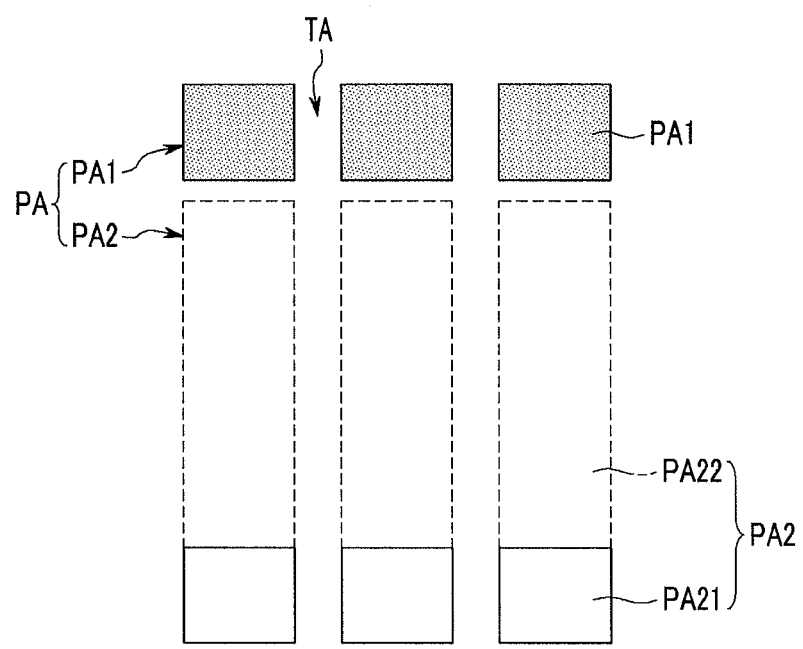
FIG. 7 is a schematic layout view showing a first display mode of an organic light emitting diode display according to an exemplary embodiment.
Figure 8:
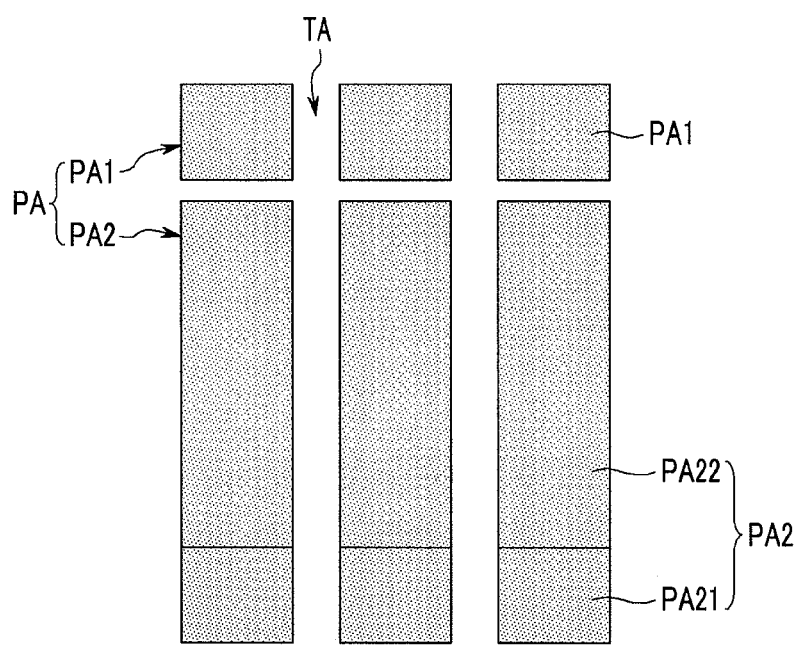
FIG. 8 is a schematic view showing a second display mode of an organic light emitting diode display according to an exemplary embodiment.

FIGS. 6 and 8 are schematic layout views of an organic light emitting diode display according to an exemplary embodiment. FIG. 6 illustrates a transparence mode of the organic light emitting diode display, FIG. 7 illustrates a first display mode of the organic light emitting diode display, and FIG. 8 illustrates a second display mode of the organic light emitting diode display.

Referring to FIG. 6, the first pixel area PA1 and the second pixel area PA2 are switched off in the transparent mode of the organic light emitting diode display. The first pixel area PA1 is an opaque region where the first pixel electrode reflects external light. The second pixel area PA2 comprises the opaque region PA21 which includes the reflective electrode and the transparent region PA22 which includes the transparent electrode. The transparent region PA22 is a transparent region that transmits light in the transparent mode.

A portion of the second pixel area PA2 functions as a transparent region to expand transparent region TA and the common electrode and the transparent electrode have light transmission of about 70% or more, such that the organic light emitting diode display 100 of the present exemplary embodiment can implement high transmittance in the transparence mode. The second pixel area PA2 has a larger area than the first pixel area PA1 and the transparent region PA22 of the second pixel area PA2 has a larger area than the opaque region PA21 in order to realize high transmittance.

Referring to FIG. 7, the first pixel area PA1 is on and the second pixel area PA2 is off in the first display mode of the organic light emitting diode display. Accordingly, the first pixel area PA1 emits light according to display data to display an image and light from the background, behind the organic light emitting diode display 100, is transmitted through the transparent region TA and the transparent region PA22 of the second pixel area PA2. Therefore, the image of the background overlaps the displayed image.

Referring to FIG. 8, the first pixel area PA1 and the second pixel area PA2 are on in the second display mode of the organic light emitting diode display. Accordingly, the first pixel area PA1 and the second pixel area PA2 emit light to display an image. In this operation, the entire pixel areas PA, outside the transparent region TA, emit light, thereby displaying a high-luminance image. The organic light emitting diode display 100 can minimize the amount of light transmitted through the display compared to the amount of light emitted by the display so that the image of an object behind the display overlapping the displayed image is significantly less noticeable.

As described above, the organic light emitting diode display 100 of various embodiments can increase the transmittance in the transmittance mode and adjust luminance and transmission of the display screen by using either the first display mode or the second display mode. Further, the organic light emitting diode display 100 has increased the life span because of the increased light emitting area of the pixel area PA.

While this disclosure has described what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode display comprising:
   a substrate having a first region;
   a plurality of gate lines, data lines and common voltage lines on the substrate; and
   a plurality of pixel areas spaced apart from each other on the substrate with the first region therebetween, wherein each pixel area comprises:
      a first pixel area having a first driver and a first organic light emitting diode, and
      a second pixel area spaced apart from the first pixel area and having a second driver and a second organic light emitting element,
   wherein the first pixel area and the second pixel area are independently turned on and wherein the first pixel area is substantially opaque and the second pixel area comprises an opaque portion and a selectively transparent portion configured to be selectively turned on based on a selective signal initiated by a user, wherein at least a portion of the plurality of gate lines, data lines and common voltage lines is disposed in the first region, and wherein the selectively transparent portion is configured to receive external light at one side of the organic light emitting diode display and emit the external light from an opposing side of the organic light emitting diode display.

2. The organic light emitting diode display of claim 1, wherein the second pixel area is larger than the first pixel area.

3. The organic light emitting diode display of claim 2, wherein:

the opaque portion covers the second driver, the selectively transparent portion is electrically connected with the opaque portion, and the selectively transparent portion is larger than the opaque portion.

4. The organic light emitting diode display of claim 3, wherein the second organic light emitting element is positioned on the opaque portion and the selectively transparent portion, and wherein the selectively transparent portion emits light when the second pixel area is in an on state, and is transparent when the second pixel area is in an off state.

5. The organic light emitting diode display of claim 1, wherein the first organic light emitting element and the second organic light emitting element include a common electrode having light transmission of about 70% or more.

6. The organic light emitting diode display of claim 1, wherein the first region is transparent and configured to receive external light at one side of the organic light emitting diode display and emit the external light from an opposing side of the organic light emitting diode display.

7. An organic light emitting diode display, comprising:

a substrate having a first region;

a plurality of pixel areas spaced apart from each other on the substrate with the first region therebetween;

a first scan driver and a second scan driver on the substrate; and a data driver on the substrate, wherein each of the pixel areas comprises:

a first pixel area comprising:

a first driver electrically connected with the first scan driver and the data driver, and a first organic light emitting diode electrically connected with the first driver, and a second pixel area comprising:

a second driver spaced apart from the first pixel area and electrically connected with the second scan driver and the data driver, and a second organic light emitting element electrically connected with the second driver, wherein the first pixel area is substantially opaque and the second pixel area comprises an opaque portion and a selectively transparent portion configured to be selectively turned on based on a selective signal initiated by a user, wherein at least a portion of the first scan driver, the second scan driver and the data driver is disposed in the first region, and wherein the selectively transparent portion is configured to receive external light at one side of the organic light emitting diode display and emit the external light from an opposing side of the organic light emitting diode display.

8. The organic light emitting diode display of claim 7, wherein the first organic light emitting element includes a first pixel electrode, a first organic emission layer, and a common electrode sequentially stacked on the substrate, and wherein the second organic light emitting element includes a second pixel electrode, a second organic emission layer, and a common electrode sequentially stacked on the substrate.

9. The organic light emitting diode display of claim 8, wherein the first pixel electrode and the first organic emission layer are formed over the entire first pixel area so as to cover the first driver, and wherein the second pixel electrode and the second organic emission layer are formed over the entire second pixel area so as to cover the second driver.

10. The organic light emitting diode display of claim 8, wherein the second pixel electrode comprises:

a reflective electrode that covers the second driver, and a transparent electrode that contacts the reflective electrode, covers at least a portion of the reflective electrode, and extends from the reflective electrode along the substrate.

11. The organic light emitting diode display of claim 10, wherein the second organic emission layer is formed on the reflective electrode and the transparent electrode, and the second organic emission layer is larger than the first organic emission layer.

12. The organic light emitting diode display of claim 10, wherein the second pixel area includes the opaque portion where the reflective electrode is positioned, and the selectively transparent portion that does not overlap the reflective electrode.

13. The organic light emitting diode display of claim 12, wherein the selectively transparent portion is larger in area than the opaque portion.

14. The organic light emitting diode display of claim 10, wherein the first pixel electrode and the reflective electrode is formed of a reflective conductive material.

15. The organic light emitting diode display of claim 10, wherein the common electrode and the transparent electrode have light transmission of about 70% or more.

16. The organic light emitting diode display of claim 7, further comprising:

a first gate line connecting the first scan driver with first drivers positioned in a row of first pixel areas on the substrate; and a second gate line connecting the second scan driver with second drivers positioned in another row of second pixel areas on the substrate.

17. The organic light emitting diode display of claim 16, further comprising data lines connecting the data driver with the first drivers and the second drivers of a column of first and second pixel areas on the substrate.

18. The organic light emitting diode display of claim 17, further comprising a control integrated circuit electrically connected with the first scan driver, the second scan driver, and the data driver, wherein the control integrated circuit includes a second scan driver controller.

19. The organic light emitting diode display of claim 18, wherein the second scan driver controller is switched on to turn on the second pixel areas in response to the selective signal.

20. The organic light emitting diode display of claim 7, wherein the first region is transparent and configured to receive external light at one side of the organic light emitting diode display and emit the external light from an opposing side of the organic light emitting diode display.

21. A method of displaying an image on a display, the method comprising:

displaying an image with a plurality of first pixel areas, the first pixel areas being opaque to external light;

selectively displaying the image with a plurality of second pixel areas, the second pixel areas having a portion opaque to the external light and a portion selectively transparent to the external light;

receiving the external light in the selectively transparent portion at a first side of the display; and emitting the external light from a second side of the display opposing the first side, wherein the portion selectively transparent to the external light is configured to be selectively turned on based on a selective signal initiated by a user, and wherein the display comprises a plurality of gate lines, data lines and common voltage lines, and at least a portion of the plurality of gate lines, data lines and common voltage lines are disposed in the selectively transparent portion.

22. The method of claim 21, wherein displaying the image with the plurality of first and second pixel areas comprises generating light and the generated light causes the external light to be substantially imperceptible.

23. The method of claim 21, further comprising transmitting the external light from the first side to the second side of the display via transparent portions of the display outside of the first and second pixel areas.

* * * * *